United States Patent
Nam

(10) Patent No.: US 9,287,220 B2
(45) Date of Patent: Mar. 15, 2016

(54) SEMICONDUCTOR PACKAGE

(71) Applicant: SAMSUNG ELECTRO-MECHANICS CO., LTD., Suwon-Si (KR)

(72) Inventor: Yun Tae Nam, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/249,080

(22) Filed: Apr. 9, 2014

(65) Prior Publication Data

US 2015/0001690 A1 Jan. 1, 2015

(30) Foreign Application Priority Data

Jun. 28, 2013 (KR) .................. 10-2013-0075875

(51) Int. Cl.
| | | |
|---|---|---|
| *H01L 23/552* | (2006.01) | |
| *H01L 23/13* | (2006.01) | |
| *H01L 23/498* | (2006.01) | |

(52) U.S. Cl.
CPC .............. *H01L 23/552* (2013.01); *H01L 23/13* (2013.01); *H01L 23/49833* (2013.01); *H01L 23/49805* (2013.01); *H01L 23/49816* (2013.01); *H01L 23/49827* (2013.01); *H01L 2924/15159* (2013.01); *H01L 2924/15311* (2013.01); *H01L 2924/19106* (2013.01)

(58) Field of Classification Search
CPC ................... H01L 27/0266; H01L 23/49805; H01L 23/49816; H01L 23/49827; H01L 23/552
USPC ...................................................... 257/659
See application file for complete search history.

(56) References Cited

U.S. PATENT DOCUMENTS

| | | | | |
|---|---|---|---|---|
| 5,422,615 A * | 6/1995 | Shibagaki et al. | ............ | 333/246 |
| 6,285,559 B1 * | 9/2001 | Fukiharu | ............... | 361/760 |
| 6,489,669 B2 * | 12/2002 | Shimada et al. | ............ | 257/686 |
| 6,932,618 B1 * | 8/2005 | Nelson | ............. | 439/66 |
| 8,890,265 B2 * | 11/2014 | Kuratani | ............ | 257/416 |
| 9,070,693 B2 * | 6/2015 | Cho | | |
| 2005/0151599 A1 * | 7/2005 | Ido et al. | ............ | 333/133 |
| 2007/0252264 A1 * | 11/2007 | Moriyama et al. | ............ | 257/690 |
| 2008/0017964 A1 * | 1/2008 | Schott et al. | ............ | 257/680 |
| 2009/0284947 A1 * | 11/2009 | Beddingfield et al. | ........ | 361/818 |
| 2010/0019359 A1 * | 1/2010 | Pagaila et al. | ............ | 257/659 |
| 2011/0222717 A1 * | 9/2011 | Kuratani et al. | ............ | 381/355 |
| 2012/0074538 A1 * | 3/2012 | Tsai et al. | ............ | 257/659 |
| 2012/0168206 A1 * | 7/2012 | Sekine et al. | ............ | 174/252 |
| 2012/0187551 A1 * | 7/2012 | Kushino et al. | ............ | 257/659 |
| 2012/0228749 A1 * | 9/2012 | Pagaila | ............ | 257/659 |
| 2012/0286414 A1 * | 11/2012 | Meyer-Berg | ............ | 257/698 |
| 2013/0127025 A1 * | 5/2013 | Cho | ............ | 257/660 |
| 2013/0221455 A1 * | 8/2013 | Manack et al. | ............ | 257/416 |
| 2013/0234337 A1 * | 9/2013 | Hsu et al. | ............ | 257/774 |
| 2013/0270691 A1 * | 10/2013 | Mallik et al. | ............ | 257/713 |

FOREIGN PATENT DOCUMENTS

KR 10-0274782 1/2001

* cited by examiner

*Primary Examiner* — Nathan Ha

(74) *Attorney, Agent, or Firm* — NSIP Law

(57) ABSTRACT

Disclosed herein is a semiconductor package. The semiconductor package according to a preferred embodiment of the present invention includes: a first substrate having an electronic device mounted on both surfaces thereof; and a second substrate bonded to one surface of the first substrate and including an insertion part in which the electronic device mounted on one surface of the first substrate is inserted, wherein the second substrate includes a ground and a shielding wall which is formed along an inner wall or an outer wall of the second substrate.

16 Claims, 11 Drawing Sheets

SEMICONDUCTOR PACKAGE

CROSS REFERENCE TO RELATED APPLICATION

This application claims the benefit of Korean Patent Application No. 10-2013-0075875, filed on Jun. 28, 2013, entitled "Semiconductor Package", which is hereby incorporated by reference in its entirety into this application.

BACKGROUND OF THE INVENTION

1. Technical Field

The present invention relates to a semiconductor package.

2. Description of the Related Art

In accordance with the rapid development of a semiconductor technology, a semiconductor device has significantly grown. Further, the development for a semiconductor package, such as a system in package (SIP), a chip sized package (CSP), and a flip chip package (FCP) which are configured as a package by mounting an electronic device, such as the semiconductor device, on a printed circuit substrate in advance has been actively conducted. To allow the semiconductor package to stably and efficiently transfer a signal, it is important to consider a function capable of shielding noise caused by a high frequency is increasingly increased. For shielding the noise to allow the semiconductor package to stably transfer a signal and provide low impedance, a process of additionally forming a ground layer in a substrate is performed (Korean Patent No. 0274782).

SUMMARY OF THE INVENTION

The present invention has been made in an effort to provide a semiconductor package having a sufficient shielding area.

Further, the present invention has been made in an effort to provide a semiconductor package capable of maintaining signal performance while improving shielding ability.

In addition, the present invention has been made in an effort to provide a semiconductor package with improved freedom of design.

According to a preferred embodiment of the present invention, there is provided a semiconductor package, including: a first substrate having an electronic device mounted on both surfaces thereof; and a second substrate bonded to one surface of the first substrate and including an insertion part in which the electronic device mounted on one surface of the first substrate is inserted, wherein the second substrate includes a ground and a shielding wall which is formed along an inner wall or an outer wall of the second substrate. The ground via may be electrically connected to the shielding wall.

The semiconductor package may further include: a first molding part sealing an electronic device mounted on the other surface of the first substrate.

The semiconductor package may further include: a first shielding film formed on an outer surface of the first molding part.

The first substrate may further include a ground layer formed therein.

The ground layer may be electrically connected to the first shielding film.

The ground layer may be electrically connected to the ground via.

The semiconductor package may further include: a ground layer formed in the first substrate and formed to have both ends exposed to an outside of the first substrate.

The first shielding film may be electrically connected to the ground layer which is exposed to the outside of the first substrate.

The ground layer may be electrically connected to the ground via.

The second substrate may further include a signal via.

In the shielding wall, a region corresponding to a position at which the signal via is formed may be opened.

The semiconductor package may further include: a shielding via formed at the position corresponding to the opened region of the shielding wall and formed on a straight line, along with the signal via.

The insertion part may have a through hole form.

The insertion part may have a groove form.

A bottom surface in the insertion part may be further provided with the shielding wall.

The first substrate may be further provided with a circuit layer.

The second substrate may further include a conductive via which is electrically connected to the first substrate.

The semiconductor package may further include: an external connection terminal foamed on one surface of the second substrate and connected to the conductive via.

The semiconductor package may further include: a second molding part formed in the insertion part to seal the first electronic device.

The semiconductor package may further include: a second shielding film formed on one surface of the second molding part and electrically connected to the shielding wall.

The semiconductor package may further include: a second molding part formed in the insertion part to seal the first electronic device.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
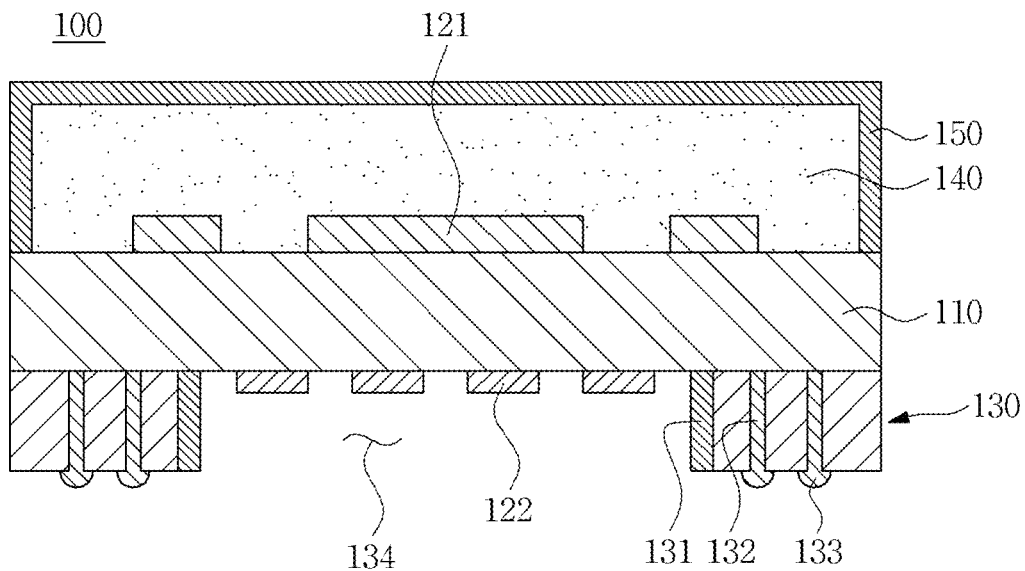
FIG. 1 is an exemplified diagram illustrating a semiconductor package according to a first preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIG. 1 is an exemplified diagram illustrating a semiconductor package according to a first preferred embodiment of the present invention.

Referring to FIG. 1, a semiconductor package 100 may include a first electronic device 122, a second electronic device 121, a first substrate 110, a second substrate 130, a molding part 140, a shielding film 150, and an external connection terminal 133.

The first electronic device 122 is mounted on one surface of the first substrate 110. Further, the second electronic device 121 is mounted on the other surface of the first substrate 110. As illustrated in FIG. 1, the one surface of the first substrate 110 becomes a bottom surface and the other surface thereof becomes a top surface. The first electronic device 122 and the second electronic device 121 may include various devices, such as a passive device and an active device. The first electronic device 122 and the second electronic device 121 are not limited to the passive device and the active device, but any device which may be mounted in the first substrate 110 may be used.

The first substrate 110 has the first electronic device 122 and the second electronic device 121 mounted on both surfaces thereof. As the first substrate 110, various types of substrates which are known in the art may be used. For example, the first substrate 110 may be a ceramic substrate, a printed circuit substrate, a flexible substrate, and the like. Although not illustrated in FIG. 1, the first substrate 110 may be provided with a circuit layer. The circuit layer may electrically connect the first substrate 110 to at least one of the first electronic device 122, the second electronic device 121, and the second substrate 130. In this configuration, the circuit layer may include a circuit pattern, a connection pad, a via, and the like. Further, the first substrate 110 may include a circuit layer having a multilayered structure. The first substrate 110 may be provided with a ground layer (not illustrated).

The second substrate 130 may be formed on one surface of the first substrate 110. As the second substrate 130, various types of substrates which are known in the art may be used. For example, the second substrate 130 may be a ceramic substrate, a printed circuit substrate, a flexible substrate, and the like. Although not illustrated in FIG. 1, the second substrate 130 may be provided with a circuit layer of one or more layer. The circuit layer may include the circuit pattern, the connection pad, and a conductive via 132. The conductive via 132 may be electrically connected with the circuit patterns which are formed in the second substrate 130. Further, the conductive via 132 may be connected to the connection pad to electrically connect the first substrate 110 to the second substrate 130. Further, although not illustrated, the second substrate 130 may be provided with a ground via (not illustrated) which is connected to the ground layer (not illustrated) of the first substrate 110.

The second substrate 130 may include an insertion part 134. Herein, the insertion part 134 may be formed in a region in which the first electronic device 122 is disposed. According to the preferred embodiment of the present invention, the insertion part 134 may be formed in a through hole form.

A shielding wall 131 may be formed on a wall surface of the insertion part 134. The shielding wall 131 may be made of a conductive metal. The shielding wall 131 may be formed by an electroplating method, an electroless plating method, a spraying method, and the like. A method for forming the shielding wall 131 is not limited thereto, and therefore the shielding wall 131 may be formed by using any of the plating methods which are used in the art. The shielding wall 131 may be electrically connected to the ground via (not illustrated).

The molding part 140 is formed on the other surface of the first substrate 110 to be able to seal the second electronic devices 121. The molding part 140 is filled between the second electronic devices 121 to be able to electrically insulate the first electronic devices 122 from each other. Further, the molding part 140 is formed to enclose the first electronic devices 122 to be able to protect the first electronic devices 122 from an external impact. The molding part 140 may be made of an insulating resin, such as epoxy resin. That is, the molding part 140 may be made of one of the molding materials which are used in the art.

The shielding film 150 may be formed to have a structure enclosing the molding part 140. The shielding film 150 may be made of a conductive material. For example, the shielding film 150 may be formed by applying a resin material including a conductive powder to an outer surface of the molding part 140. Alternatively, the shielding film 150 may be formed by attaching a metal thin film to the outer surface of the molding part 140. Herein, the metal thin film may be formed by various methods, such as sputtering, vapor deposition, spray coating, screen printing, electroplating, and electroless plating. The shielding film 150 may be independently formed without being separately connected to other components or may be electrically connected to the ground layer (not illustrated) of the first substrate 110.

The external connection terminal 133 may be formed on one surface of the second substrate 130. The external connection terminal 133 may be electrically connected to the conductive via 132 or the connection pad (not illustrated) of the second substrate 130. The external connection terminal 133 may electrically and physically connect the semiconductor package 100 to a main substrate (not illustrated) on which the semiconductor package 100 is mounted. For example, the external connection terminal 133 may be formed as a solder bump or a solder ball.

Although not illustrated in the preferred embodiment of the present invention, an insulating layer (not illustrated) may be formed between the first substrate 110 and the second substrate 130. The insulating layer may protect a conductive member (not illustrated), such as a bump, which electrically connects the first substrate 110 to the second substrate 130. Further, the insulating layer (not illustrated) may improve an adhesion between the first substrate 110 and the second substrate 130. As such, the insulating layer (not illustrated) protects the conductive member and the adhesion between the first substrate 110 and the second substrate is improved, such that the reliability of the semiconductor package 110 may be improved.

Figure 2:
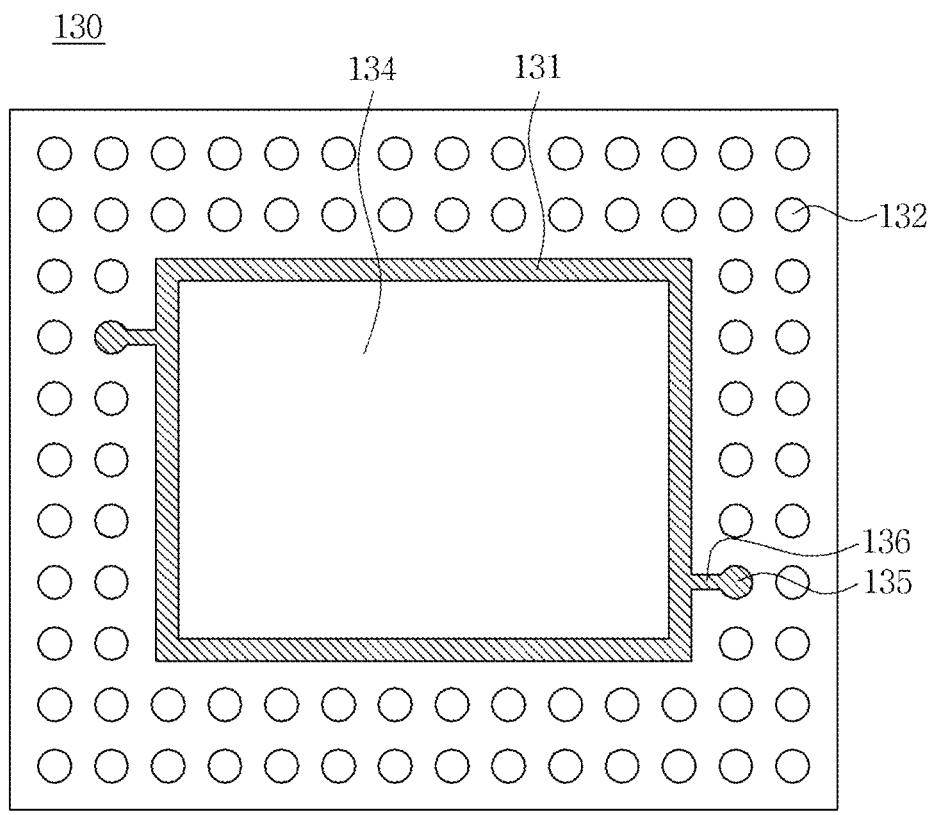
FIG. 2 is an exemplified diagram illustrating a cross section of a second substrate according to the first preferred embodiment of the present invention.

FIG. 2 is an exemplified diagram illustrating a cross section of a second substrate according to the first preferred embodiment of the present invention.

Referring to FIG. 2, the second substrate 130 includes the insertion part 134, the shielding wall 131, the ground via 135, a ground pattern 136, and the conductive via 132.

The insertion part 134 of the second substrate 130 may be inserted with the first electronic device 122 (FIG. 1) which is mounted on the first substrate 110 (FIG. 1).

The shielding wall 131 according to the preferred embodiment of the present invention may be formed along the wall surface of the insertion part 134. Further, the shielding wall 131 may be electrically connected to the ground via 135. In this case, the shielding wall 131 and the ground via 135 may be connected to each other through the ground pattern 136.

The ground via 135 may be electrically connected to the ground layer (not illustrated) of the first substrate 110 (FIG. 1). That is, the shielding wall 131 may be electrically connected to the ground layer (not illustrated) through the ground via 135.

The conductive via 132 may electrically connect the external connection terminal 133 (FIG. 1) to at least one of the circuit patterns which are formed in the first substrate 110 (FIG. 1) and the second substrate 130.

The second substrate 130 may perform the shielding between the first electronic device 122 (FIG. 1) and an outside of the semiconductor package 100 (FIG. 1) by the shielding wall 131 having the above structure.

Figure 3:
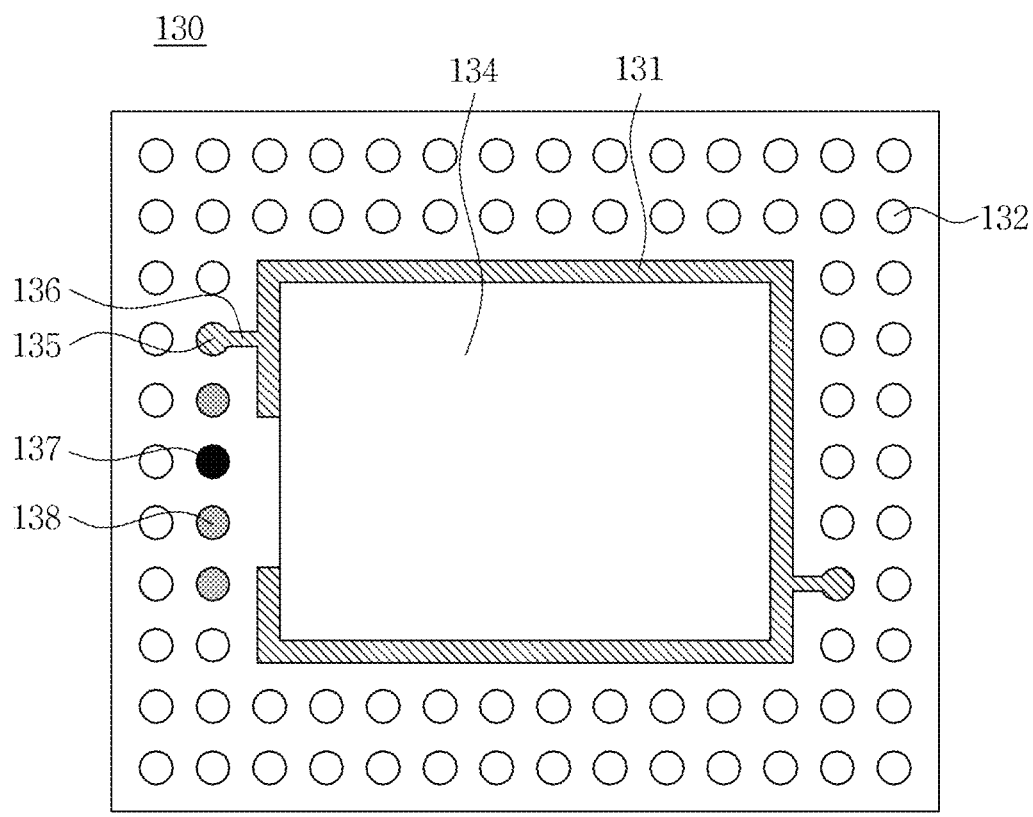
FIG. 3 is another exemplified diagram illustrating a cross section of a second substrate according to the first preferred embodiment of the present invention.

FIG. 3 is another exemplified diagram illustrating a cross section of a second substrate according to the first preferred embodiment of the present invention.

Referring to FIG. 3, the second substrate 130 includes a signal via 137, the insertion part 134, the shielding wall 131, the ground via 135, the ground pattern 136, a shielding via 138, and the conductive via 132.

The insertion part 134 of the second substrate 130 may be inserted with the first electronic device 122 (FIG. 1) which is mounted on the first substrate 110 (FIG. 1).

The signal via 137 may electrically connect the first substrate 110 (FIG. 1) to at least one of the first electronic device 122 (FIG. 1) and the second electronic device 121 (FIG. 1) through the circuit layer. Further, the signal via 137 may transmit an electric signal to the outside or receive the electric signal from the outside. For example, the signal via 137 may transmit and receive an RF signal.

The shielding wall 131 may be formed along the wall surface of the insertion part 134. In this case, the shielding wall 131 may be formed so as to open a region corresponding to a position at which the signal via 137 is formed. This is to prevent the performance of the signal via 137 transmitting and receiving the electric signal from reducing. The shielding wall 131 may be electrically connected to the ground via 135. In this case, the shielding wall 131 and the ground via 135 may be connected to each other through the ground pattern 136.

The ground via 135 may be electrically connected to the ground layer (not illustrated) of the first substrate 110 (FIG. 1). That is, the shielding wall 131 may be electrically connected to the ground layer (not illustrated) through the ground via 135.

The shielding via 138 may be formed to prevent the shielding performance from reducing when the opened region of the shielding wall 131 is large. Therefore, the shielding via 138 may be formed at a position corresponding to the opened region of the shielding wall 131. For example, the shielding via 138 may be formed on a straight line, along with the signal via 137. In this case, a distance between the signal via 137 and the shielding via 138 may also be set to be a distance enough to keep the signal performance of the signal via 137 Herein, the signal performance may be a performance of allowing the signal via 137 to transmit and receive an electric signal. The shielding via 138 may be electrically connected to the ground layer (not illustrated) of the first substrate 110 (FIG. 1) to perform the shielding function.

The conductive via 132 may electrically connect the external connection terminal 133 (FIG. 1) to at least one of the circuit patterns which are formed in the first substrate 110 (FIG. 1) and the second substrate 130.

According to the preferred embodiment of the present invention, the region in which the shielding wall 131 is opened by the signal via 137 is shielded by the shielding via 138, thereby preventing the shielding function of the second substrate 130 from reducing.

Figure 4:
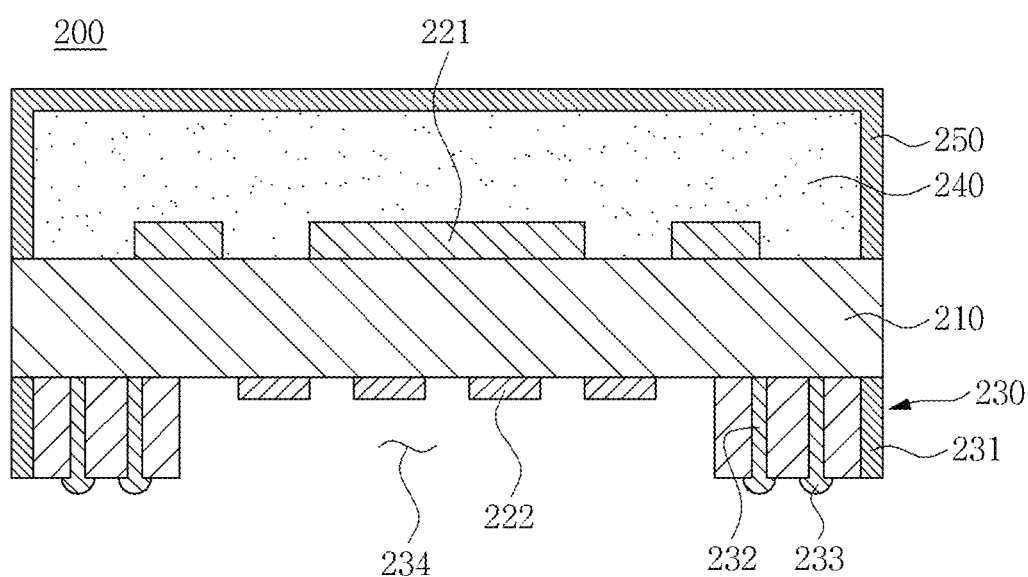
FIG. 4 is an exemplified diagram illustrating a semiconductor package according to a second preferred embodiment of the present invention.

FIG. 4 is an exemplified diagram illustrating a semiconductor package according to a second preferred embodiment of the present invention.

Referring to FIG. 4, a semiconductor package 200 may include a first electronic device 222, a second electronic device 221, a first substrate 210, a second substrate 230, a molding part 240, a shielding film 250, and an external connection terminal 233.

The first electronic device 222 is mounted on one surface of the first substrate 210. Further, the second electronic device 221 is mounted on the other surface of the first substrate 210. The first electronic device 222 and the second electronic device 221 may include various devices, such as a passive device and an active device, but any device which may be mounted in the first substrate 210 may be used.

The first substrate 210 has the first electronic device 222 and the second electronic device 221 mounted on both surfaces thereof. As the first substrate 210, various types of substrates which are known in the art may be used. Although not illustrated in FIG. 4, the first substrate 210 may be provided with a circuit layer. In addition, the first substrate 210 may be provided with the ground layer (not illustrated).

The second substrate 230 may be formed on one surface of the first substrate 210. As the second substrate 230, various types of substrates which are known in the art may be used. Although not illustrated in FIG. 4, the second substrate 230 may be provided with a circuit layer of one or more layer. The circuit layer may include the circuit pattern, the connection pad, and a conductive via 232. The connection via 232 may be electrically connected with the circuit patterns which are formed in the second substrate 230. Further, the conductive via 232 may be connected to the connection pad to electrically connect the first substrate 210 to the second substrate 230. Further, although not illustrated, the second substrate 230 may be provided with a ground via (not illustrated) which is connected to the ground layer (not illustrated) of the first substrate 210.

The second substrate 230 may include an insertion part 234. Herein, the insertion part 234 may be formed in a region in which the first electronic device 222 is disposed. According to the preferred embodiment of the present invention, the insertion part 234 may be formed in a through hole form.

The shielding wall 131 may be formed on an outer wall of the second substrate 230. The shielding wall 231 may be made of a conductive metal. A method for forming the shielding wall 231 may be formed by using any of the plating methods which are used in the art. The shielding wall 231 may be electrically connected to the ground via (not illustrated).

The molding part 240 is formed on the other surface of the first substrate 210 to be able to seal the second electronic devices 221. The molding part 240 is filled between the second electronic devices 221 to be able to electrically insulate the first electronic devices 222 from each other. Further, the molding part 240 is formed to enclose the first electronic devices 222 to be able to protect the first electronic devices 222 from an external impact. The molding part 240 may be made of an insulating resin, such as epoxy resin.

The shielding film 250 may be formed to have a structure enclosing the molding part 240. The shielding film 250 may be made of a conductive material. The shielding film 250 may be independently formed without being separately connected to other components or may be electrically connected to the ground layer (not illustrated) of the first substrate 210.

The external connection terminal 233 is formed on one surface of the second substrate 230 to be able to be electrically connected to the conductive via 232 or the connection pad (not illustrated). The external connection terminal 233 may electrically and physically connect the semiconductor package 200 to a main substrate (not illustrated) on which the semiconductor package 200 is mounted. For example, the external connection terminal 233 may be formed as a solder bump or a solder ball.

Although not illustrated in the preferred embodiment of the present invention, an insulating layer (not illustrated) may be formed between the first substrate 210 and the second substrate 230. The insulating layer (not illustrated) may protect a conductive member (not illustrated), such as a bump, which is disposed between the first substrate 210 and the second substrate 230. Further, the insulating layer (not illustrated) may improve an adhesion between the first substrate 210 and the second substrate 230. As such, the reliability of the semiconductor package 200 may be improved by the insulating layer (not illustrated).

Figure 5:
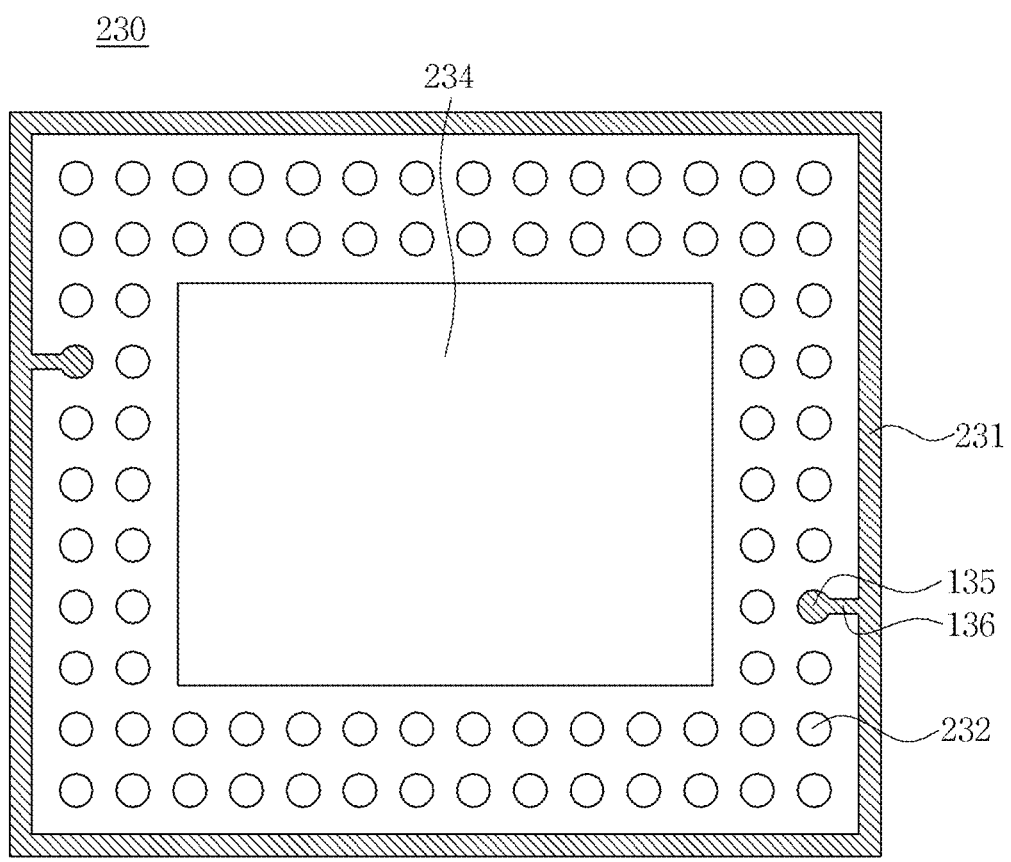
FIG. 5 is an exemplified diagram illustrating a cross section of a second substrate according to the second preferred embodiment of the present invention.

FIG. 5 is an exemplified diagram illustrating a cross section of a second substrate according to the second preferred embodiment of the present invention.

Referring to FIG. 5, the second substrate 230 includes the insertion part 234, the shielding wall 231, the ground via 235, a ground pattern 236, and the conductive via 232.

The insertion part 234 of the second substrate 230 may be inserted with the first electronic device 222 (FIG. 4) which is mounted on the first substrate 210 (FIG. 4).

The shielding wall 231 according to the preferred embodiment of the present invention may be formed along the outer wall of the second substrate 230. Further, the shielding wall 231 may be electrically connected to the ground via 235. In this case, the shielding wall 231 and the ground via 235 may be connected to each other through the ground pattern 236.

The ground via 235 may be electrically connected to the ground layer (not illustrated) of the first substrate 210 (FIG. 4). That is, the shielding wall 231 may be electrically connected to the ground layer (not illustrated) through the ground via 235.

The conductive via 232 may electrically connect the external connection terminal 233 (FIG. 4) to at least one of the circuit patterns which are formed in the first substrate 210 (FIG. 4) and the second substrate 230.

The second substrate 230 may perform the shielding between the first electronic device 222 (FIG. 4) and an outside of the semiconductor package 200 (FIG. 4) by the shielding wall 231 having the above structure.

Figure 6:
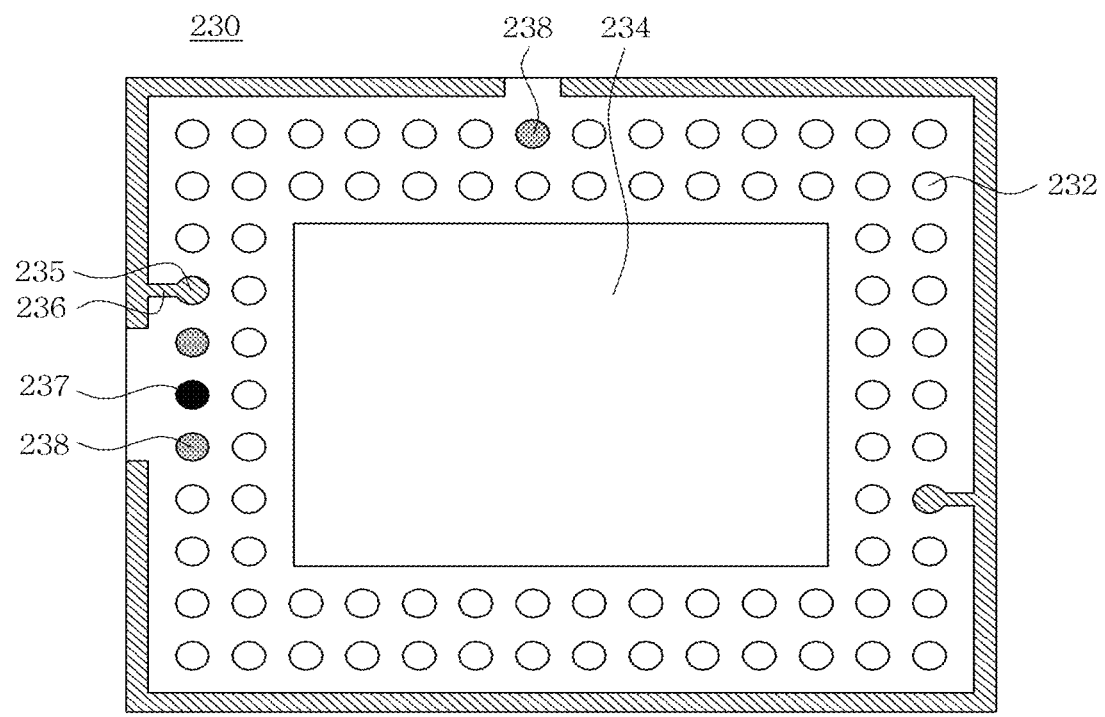
FIG. 6 is another exemplified diagram illustrating a cross section of the second substrate according to the second preferred embodiment of the present invention.

FIG. 6 is another exemplified diagram illustrating a cross section of the second substrate according to the second preferred embodiment of the present invention.

Referring to FIG. 6, the second substrate 230 includes the insertion part 234, a signal via 237, the shielding wall 231, the ground via 235, the ground pattern 236, a shielding via 238, and the conductive via 232.

The insertion part 234 of the second substrate 230 may be inserted with the first electronic device 222 (FIG. 4) which is mounted on the first substrate 210 (FIG. 4).

The signal via 237 may electrically connect the first substrate 210 (FIG. 4) to at least one of the first electronic device 222 (FIG. 4) and the second electronic device 211 (FIG. 4) through the circuit layer. The signal via 237 may transmit an electric signal, such as an RF signal, to the outside or receive the electric signal from the outside.

The shielding wall 231 may be formed along the outer wall of the second substrate 230. In this case, the shielding wall 231 may be formed so as to open a region corresponding to a position at which the signal via 237 is formed. This is to prevent the performance of the signal via 237 transmitting and receiving the electric signal from reducing. The shielding wall 231 may be electrically connected to the ground via 235. In this case, the shielding wall 231 and the ground via 235 may be connected to each other through the ground pattern 236. Further, a region in which the shielding wall 231 is opened may be added depending on a demand of a designer.

The ground via 235 may be electrically connected to the ground layer (not illustrated) of the first substrate 210 (FIG. 4). That is, the shielding wall 231 may be electrically connected to the ground layer (not illustrated) through the ground via 235.

The shielding via 238 may be formed to prevent the shielding performance from reducing when the opened region of the shielding wall 231 is large. Therefore, the shielding via 238 may be formed at a position corresponding to the opened region of the shielding wall 231. According to the preferred embodiment of the present invention, the shielding via 238 may be formed on a straight line, along with the signal via 237. The shielding via 238 may be electrically connected to the ground layer (not illustrated) of the first substrate 210 (FIG. 4) to perform the shielding function.

The conductive via 232 may electrically connect the external connection terminal 233 (FIG. 4) to at least one of the circuit patterns which are formed in the first substrate 210 (FIG. 4) and the second substrate 230.

Figure 7:
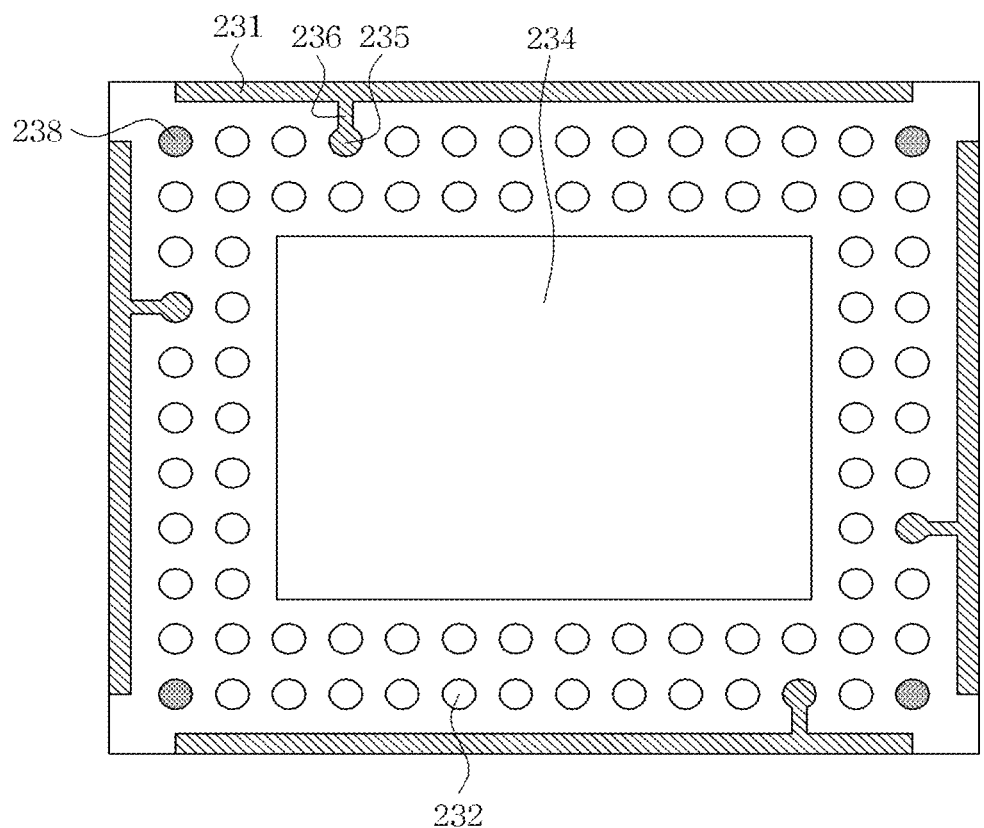
FIG. 7 is another exemplified diagram illustrating a cross section of the second substrate according to the second preferred embodiment of the present invention.

FIG. 7 is another exemplified diagram illustrating a cross section of the second substrate according to the second preferred embodiment of the present invention.

Referring to FIG. 7, the second substrate 230 includes the insertion part 234, the shielding wall 231, the ground via 235, the ground pattern 236, the shielding via 238, and the conductive via 232.

The insertion part 234 of the second substrate 230 may be inserted with the first electronic device 222 (FIG. 4) which is mounted on the first substrate 210 (FIG. 4).

The shielding wall 231 may be formed along the outer wall of the second substrate 230. The shielding wall 231 may be electrically connected to the ground via 235. In this case, the shielding wall 231 and the ground via 235 may be connected to each other through the ground pattern 236. Further, the ground via 235 may be electrically connected to the ground layer (not illustrated) of the first substrate 210 (FIG. 4). According to the preferred embodiment of the present invention, the shielding wall 231 may be formed, except for a corner portion of the wall surface of the second substrate 230. Herein, the corner portion of the second substrate 230 may not suffer from sufficient plating for forming the shielding wall 231. Since the region in which the shielding wall 231 is not formed completely has the reduced shielding function, the shielding via 238 for improving the shielding function may be formed.

By the structure of the shielding wall 231, the shielding via 238 may be formed at the corner portion of the second substrate 230. The shielding via 238 may be formed to prevent the shielding performance from reducing when the opened region of the shielding wall 231 is large. According to the preferred embodiment of the present invention, the shielding via 238 may be formed at the corner portion of the second substrate 230 at which the shielding wall 231 is not formed. The shielding via 238 may be electrically connected to the ground layer (not illustrated) of the first substrate 210 (FIG. 4).

The conductive via 232 may electrically connect the external connection terminal 233 (FIG. 4) to at least one of the circuit patterns which are formed in the first substrate 210 (FIG. 4) and the second substrate 230.

Referring to FIGS. 6 and 7, the region in which the shielding wall 231 is opened by the signal via 237 is shielded by the shielding via 238, thereby preventing the shielding function of the second substrate 230 from reducing.

Figure 8:
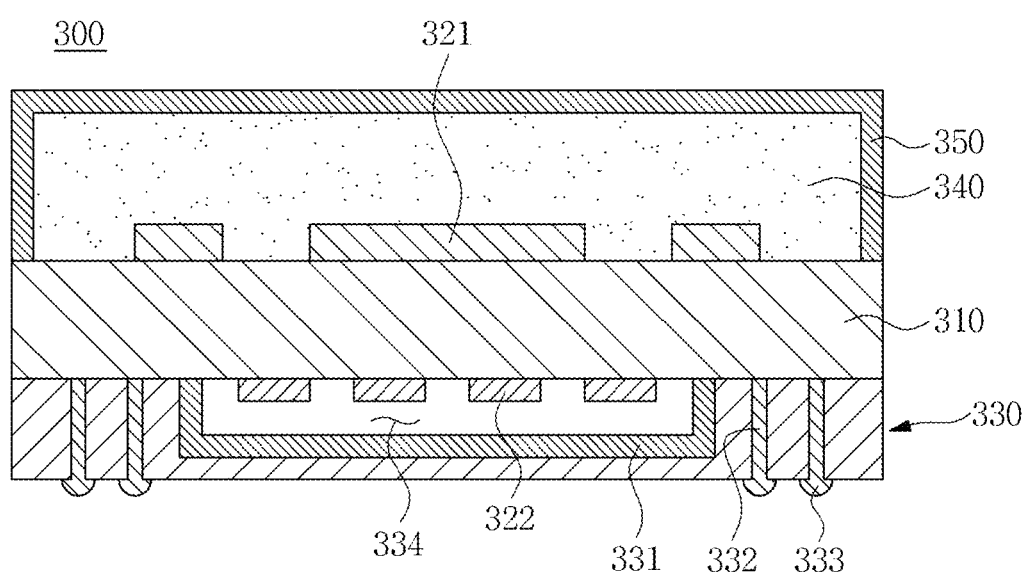
FIG. 8 is an exemplified diagram illustrating a semiconductor package according to a third preferred embodiment of the present invention.

FIG. 8 is an exemplified diagram illustrating a semiconductor package according to a third preferred embodiment of the present invention.

Referring to FIG. 8, a semiconductor package 300 may include a first electronic device 322, a second electronic device 321, a first substrate 310, a second substrate 330, a molding part 340, a shielding film 350, and an external connection terminal 333.

The first electronic device 322 is mounted on one surface of the first substrate 310. Further, the second electronic device 321 is mounted on the other surface of the first substrate 310. The first electronic device 322 and the second electronic device 321 may include various devices, such as a passive device and an active device, but any device which may be mounted in the first substrate 310 may be used.

The first substrate 310 has the first electronic device 322 and the second electronic device 321 mounted on both surfaces thereof. As the first substrate 310, various types of substrates which are known in the art may be used. Although not illustrated in FIG. 8, the first substrate 310 may be provided with a circuit layer. In addition, the first substrate 310 may be provided with the ground layer (not illustrated).

The second substrate 330 may be formed on one surface of the first substrate 310. As the second substrate 330, various types of substrates which are known in the art may be used. Although not illustrated in FIG. 8, the second substrate 330 may be provided with a circuit layer of one or more layer. The circuit layer may include the circuit pattern, the connection pad, and a conductive via 332. The connection via 332 may be electrically connected with the circuit patterns which are formed in the second substrate 330. Further, the conductive via 332 may be connected to the connection pad to electrically connect the first substrate 310 to the second substrate 330. Further, although not illustrated, the second substrate 330 may be provided with a ground via (not illustrated) which is connected to the ground layer (not illustrated) of the first substrate 310.

The second substrate 330 may include an insertion part 334. Herein, the insertion part 334 may be formed in a region in which the first electronic device 322 is disposed. According to the preferred embodiment of the present invention, the insertion part 334 may be formed in a groove form. The insertion part 334 of the second substrate 330 is formed in a groove form, thereby improving the structural reliability of the second substrate 330. Further, it is possible to prevent the first electronic device 322 from being exposed to the outside. Therefore, the second substrate 330 may protect the first electronic device 322 from the external physical impact.

A wall surface and a bottom surface of the insertion part 334 formed on the second substrate 330 may be provided with the shielding wall 331. The shielding wall 331 may be made of a conductive metal. A method for forming the shielding wall 331 may be formed by using any of the plating methods which are used in the art. The shielding wall 331 may be electrically connected to the ground via (not illustrated). According to the preferred embodiment of the present invention, the shielding wall 331 may be formed in a form enclosing the first electronic device 322 inserted into the insertion part 334. The shielding between the first electronic device 322 and the outside may be simultaneously performed at both of a side and a bottom surface of the shielding wall 331 by the above-mentioned structure.

The molding part 340 may be formed on the other surface of the first substrate 310. The molding part 340 may seal the second electronic devices 321 which are formed on the other surface of the first substrate 310. The molding part 340 is filled between the second electronic devices 321 to be able to electrically insulate the first electronic devices 322 from each other. Further, the molding part 340 is formed to enclose the first electronic devices 322 to be able to protect the first electronic devices 322 from an external impact. The molding part 340 may be made of an insulating resin, such as epoxy resin.

The shielding film 350 may be formed to have a structure enclosing the molding part 340. The shielding film 350 may be made of a conductive material. For example, the shielding film 350 may be formed by applying a resin material including a conductive powder to an outer surface of the molding part 340. Alternatively, the shielding film 350 may be formed by attaching a metal thin film to the outer surface of the molding part 340. The shielding film 350 may be independently formed without being separately connected to other components or may be electrically connected to the ground layer (not illustrated) of the first substrate 310.

The external connection terminal 333 may be formed on one surface of the second substrate 330. The external connection terminal 333 may be electrically connected to the conductive via 332 or the connection pad (not illustrated) of the second substrate 330. The so formed external connection terminal 333 may electrically and physically connect the semiconductor package 300 to a main substrate (not illustrated) on which the semiconductor package 300 is mounted. For example, the external connection terminal 333 may be formed as a solder bump or a solder ball.

Although not illustrated in the preferred embodiment of the present invention, an insulating layer (not illustrated) may be formed between the first substrate 310 and the second substrate 330. The insulating layer may protect a conductive member (not illustrated), such as a bump, which electrically connects the first substrate 310 to the second substrate 330. Further, the insulating layer (not illustrated) may improve an adhesion between the first substrate 310 and the second substrate 330. As such, the reliability of the semiconductor package 300 may be improved by the insulating layer (not illustrated).

The semiconductor package 300 according to the preferred embodiment of the present invention simultaneously shields a side and a bottom surface of the second substrate 330, thereby improving the shielding function.

Figure 9:
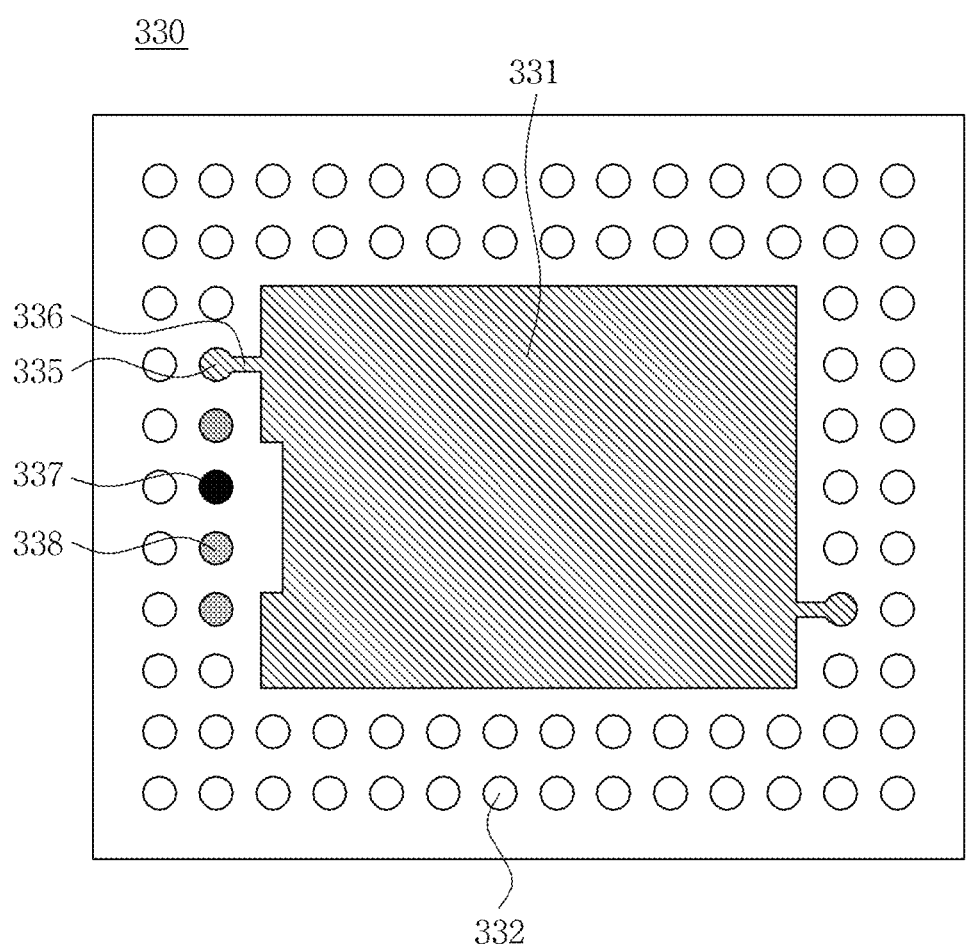
FIG. 9 is an exemplified diagram illustrating a cross section of a second substrate according to the third preferred embodiment of the present invention.

FIG. 9 is an exemplified diagram illustrating a cross section of a second substrate according to the third preferred embodiment of the present invention.

Referring to FIG. 9, the second substrate 330 includes the insertion part 334, a signal via 337, the shielding wall 331, the ground via 335, the ground pattern 336, a shielding via 338, and the conductive via 332.

The insertion part 334 (FIG. 8) into which the first electronic device 322 (FIG. 8) is inserted may be formed in a groove shape as illustrated in FIG. 8.

The signal via 337 may electrically connect the first substrate 310 (FIG. 8) to at least one of the first electronic device 322 (FIG. 8) and the second electronic device 321 (FIG. 8) through the circuit layer. The signal via 337 may transmit an electric signal, such as an RF signal, to the outside or receive the electric signal from the outside.

The shielding wall 331 may be formed on a wall surface and a bottom surface of the insertion part 334 (FIG. 8). The shielding wall 331 illustrated in FIG. 9 is formed on the bottom surface of the insertion part 334 (FIG. 8). The shielding wall 331 may be formed so as to open a region corresponding to a position at which the signal via 337 is formed. This is to prevent the performance of the signal via 337 transmitting and receiving the electric signal from reducing. Herein, the shielding wall 331 may be opened to be spaced apart from the signal via 337 by a predetermined distance. Herein, the predetermined distance may be set to be a distance enough to keep the signal performance of the signal via 337. The shielding wall 331 may be electrically connected to the ground via 335. In this case, the shielding wall 331 and the ground via 335 may be connected to each other through the ground pattern 336.

The ground via 335 may be electrically connected to the ground layer (not illustrated) of the first substrate 310 (FIG. 8). By the connection relationship, the shielding wall 331 may shield the first electronic device 322 (FIG. 8) from the outside of the semiconductor package 300 (FIG. 8).

The shielding via 338 may be formed to prevent the shielding performance from reducing when the opened region of the shielding wall 331 is large. Therefore, the shielding via 338 may be formed at a position corresponding to the opened region of the shielding wall 331. According to the preferred embodiment of the present invention, the shielding via 338 may be formed on a straight line, along with the signal via 337. In this case, a distance between the signal via 337 and the shielding via 338 may also be set to be a distance enough to keep the signal performance of the signal via 337. The shielding via 338 may be electrically connected to the ground layer (not illustrated) of the first substrate 310 (FIG. 8) to perform the shielding function.

The conductive via 332 may electrically connect the external connection terminal 333 (FIG. 8) to at least one of the circuit patterns which are formed in the first substrate 310 (FIG. 8) and the second substrate 330.

Figure 10:
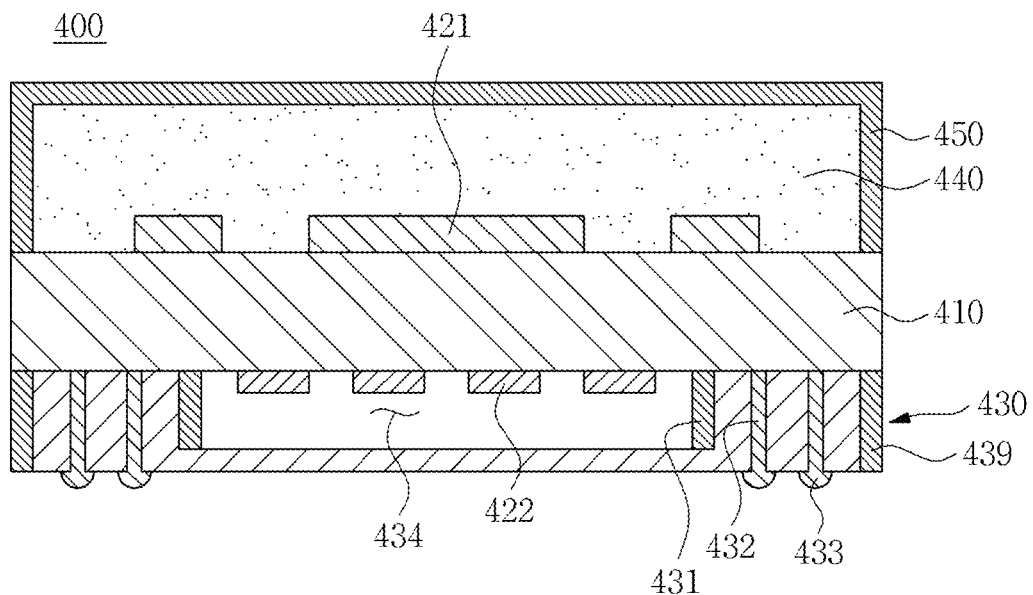
FIG. 10 is an exemplified diagram illustrating a semiconductor package according to a fourth preferred embodiment of the present invention.

FIG. 10 is an exemplified diagram illustrating a semiconductor package according to a fourth preferred embodiment of the present invention.

Referring to FIG. 10, a semiconductor package 400 may include a first electronic device 422, a second electronic device 421, a first substrate 410, a second substrate 430, a molding part 440, a shielding film 450, and an external connection terminal 433.

The first electronic device 422 is mounted on one surface of the first substrate 410. Further, the second electronic device 421 is mounted on the other surface of the first substrate 410. The first electronic device 422 and the second electronic device 421 may include various devices, such as a passive device and an active device, but any device which may be mounted in the first substrate 410 may be used.

The first substrate 410 has the first electronic device 422 and the second electronic device 421 mounted on both surfaces thereof. As the first substrate 410, various types of substrates which are known in the art may be used. Although not illustrated in FIG. 10, the first substrate 410 may be provided with a circuit layer. In addition, the first substrate 410 may be provided with the ground layer (not illustrated).

The second substrate 430 may be formed on one surface of the first substrate 410. As the second substrate 430, various types of substrates which are known in the art may be used. Although not illustrated in FIG. 10, the second substrate 430 may be provided with a circuit layer of one or more layer. The circuit layer may include the circuit pattern, the connection pad, and a conductive via 432. The connection via 432 may be electrically connected with the circuit patterns which are formed in the second substrate 430. Further, the conductive via 432 may be connected to the connection pad to electrically connect the first substrate 410 to the second substrate 430. Further, although not illustrated, the second substrate 430 may be provided with a ground via (not illustrated) which is connected to the ground layer (not illustrated) of the first substrate 410.

The second substrate 430 may include an insertion part 434. Herein, the insertion part 434 may be formed in a region in which the first electronic device 422 is disposed. According to the preferred embodiment of the present invention, the insertion part 434 may be formed in a groove form. The insertion part 434 of the second substrate 430 is formed in a groove form, thereby improving the structural reliability of the second substrate 430. Further, it is possible to prevent the first electronic device 422 from being exposed to the outside. Therefore, the second substrate 430 may protect the first electronic device 422 from the external physical impact.

A wall surface of the insertion part 434 may be provided with a first shielding wall 431. In addition, an outer wall of the second substrate 430 may be provided with a second shielding wall 439. The first shielding wall 431 and the second shielding wall 439 may be made of a conductive metal. A method for forming the first shielding wall 431 and the second shielding wall 439 may be formed by using any of the plating methods which are used in the art. The first shielding wall 431 and the second shielding wall 439 may be electrically connected to the ground via (not illustrated). According to the preferred embodiment of the present invention, the first shielding wall 431 may be formed in a form enclosing the first electronic device 422 inserted into the insertion part 434. The shielding between the first electronic device 422 (FIG. 10) and the outside of the semiconductor package 400 may be doubly performed by the so formed first shielding wall 431 and second shielding wall 439.

The molding part 440 may be formed on the other surface of the first substrate 410. The molding part 440 may seal the second electronic devices 421 which are formed on the other surface of the first substrate 410. The molding part 440 is filled between the second electronic devices 421 to be able to electrically insulate the first electronic devices 422 from each other. Further, the molding part 440 is formed to enclose the first electronic devices 422 to be able to protect the first electronic devices 422 from an external impact. The molding part 440 may be made of an insulating resin, such as epoxy resin.

The shielding film 450 may be formed to have a structure enclosing the molding part 440. The shielding film 450 may be made of a conductive material. For example, the shielding film 450 may be formed by applying a resin material including a conductive powder to an outer surface of the molding part 440. Alternatively, the shielding film 450 may be formed by attaching a metal thin film to the outer surface of the molding part 440. The shielding film 450 may be independently formed without being separately connected to other components or may be electrically connected to the ground layer (not illustrated) of the first substrate 410.

The external connection terminal 433 may be formed on one surface of the second substrate 430. The external connection terminal 433 may be electrically connected to the conductive via 432 or the connection pad (not illustrated) of the second substrate 430. The so formed external connection terminal 433 may electrically and physically connect the semiconductor package 400 to a main substrate (not illustrated) on which the semiconductor package 400 is mounted. For example, the external connection terminal 433 may be formed as a solder bump or a solder ball.

Although not illustrated in the preferred embodiment of the present invention, an insulating layer (not illustrated) may be formed between the first substrate 410 and the second substrate 430. The insulating layer may protect a conductive member (not illustrated), such as a bump, which electrically connects the first substrate 410 to the second substrate 430. Further, the insulating layer (not illustrated) may improve an adhesion between the first substrate 410 and the second substrate 430. As such, the reliability of the semiconductor package 400 may be improved by the insulating layer (not illustrated).

The semiconductor package 400 according to the preferred embodiment of the present invention may improve the shielding function due to a double shielding structure.

Figure 11:
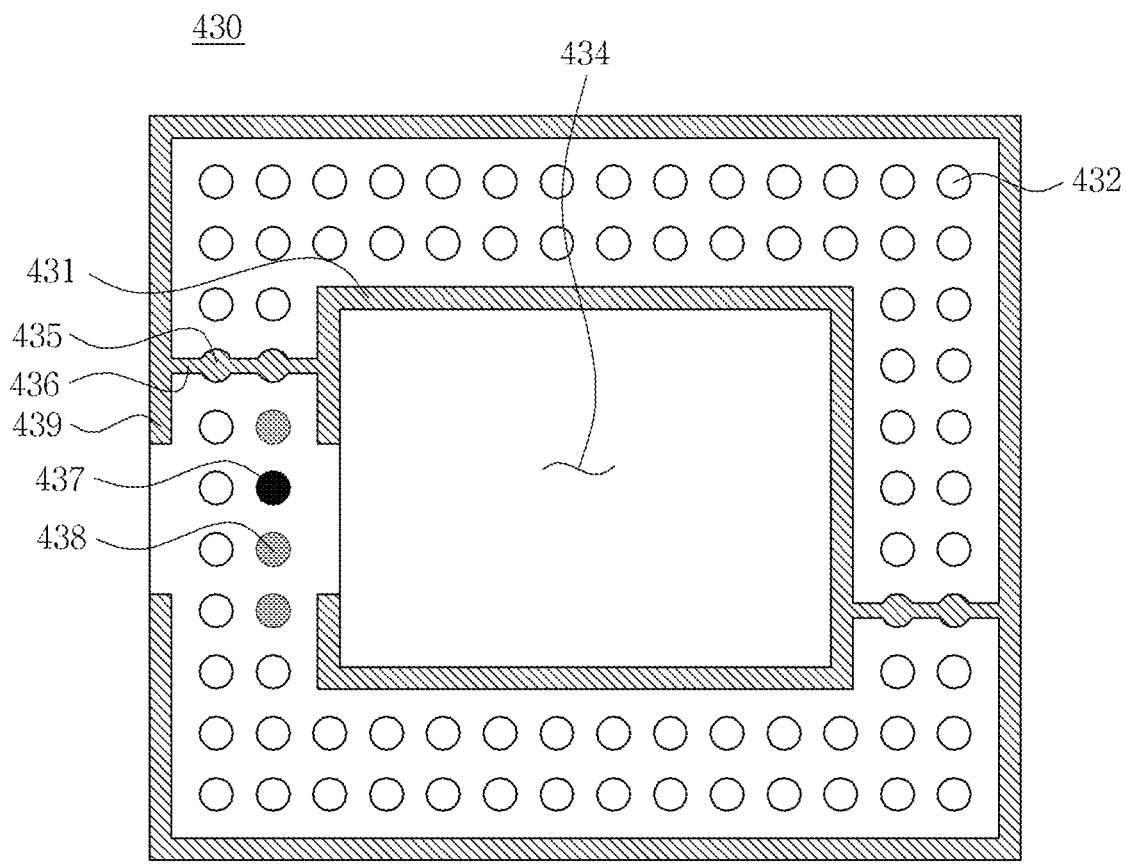
FIG. 11 is an exemplified diagram illustrating a cross section of a second substrate according to the fourth preferred embodiment of the present invention.

FIG. 11 is an exemplified diagram illustrating a cross section of a second substrate according to the fourth preferred embodiment of the present invention.

Referring to FIG. 11, the second substrate 430 includes the insertion part 434, a signal via 437, the first shielding wall 431, the second shielding wall 439, the ground via 435, the ground pattern 436, a shielding via 438, and the conductive via 432.

The insertion part 434 into which the first electronic device 422 (FIG. 10) is inserted may be formed in a groove shape as illustrated in FIG. 11.

The signal via 437 may electrically connect the first substrate 410 (FIG. 10) to at least one of the first electronic device 422 (FIG. 10) and the second electronic device 421 (FIG. 10) through the circuit layer. The signal via 437 may transmit an electric signal, such as an RF signal, to the outside or receive the electric signal from the outside.

The first shielding wall 431 may be formed on the wall surface of the insertion part 434. In addition, the second shielding wall 439 may be formed on the outer wall of the second substrate 430. The first shielding wall 431 and the second shielding wall 439 may be formed to open a region corresponding to a position at which the signal via 437 is formed. This is to prevent the performance of the signal via 437 transmitting and receiving the electric signal from reducing.

The first shielding wall 431 and the second shielding wall 439 may be electrically connected to the ground via 435 through the ground pattern 436. In this case, as illustrated in FIG. 11, the first shielding wall 431 and the second shielding wall 439 may be connected to each other by the ground via 435 and the ground pattern 436. Alternatively, each of the first shielding wall 431 and the second shielding wall 439 may individually be connected to another ground via 435.

The ground via 435 may be electrically connected to the ground layer (not illustrated) of the first substrate 410 (FIG. 10). By the connection relationship, the shielding wall 431 may shield the first electronic device 422 (FIG. 10) from the outside of the semiconductor package 400 (FIG. 10).

The shielding via 438 may be formed to prevent the shielding performance from reducing when the opened region of the shielding wall 431 is large. Therefore, the shielding via 438 may be formed at a position corresponding to the opened region of the shielding wall 431. According to the preferred embodiment of the present invention, the shielding via 438 may be formed on a straight line, along with the signal via 437. In this case, a distance between the signal via 437 and the shielding via 438 may also be set to be a distance enough to keep the signal performance of the signal via 437 The shielding via 438 may be electrically connected to the ground layer (not illustrated) of the first substrate 410 (FIG. 10) to perform the shielding function.

The conductive via 432 may electrically connect the external connection terminal 433 (FIG. 10) to at least one of the circuit patterns which are formed in the first substrate 410 (FIG. 10) and the second substrate 430.

Figure 12:
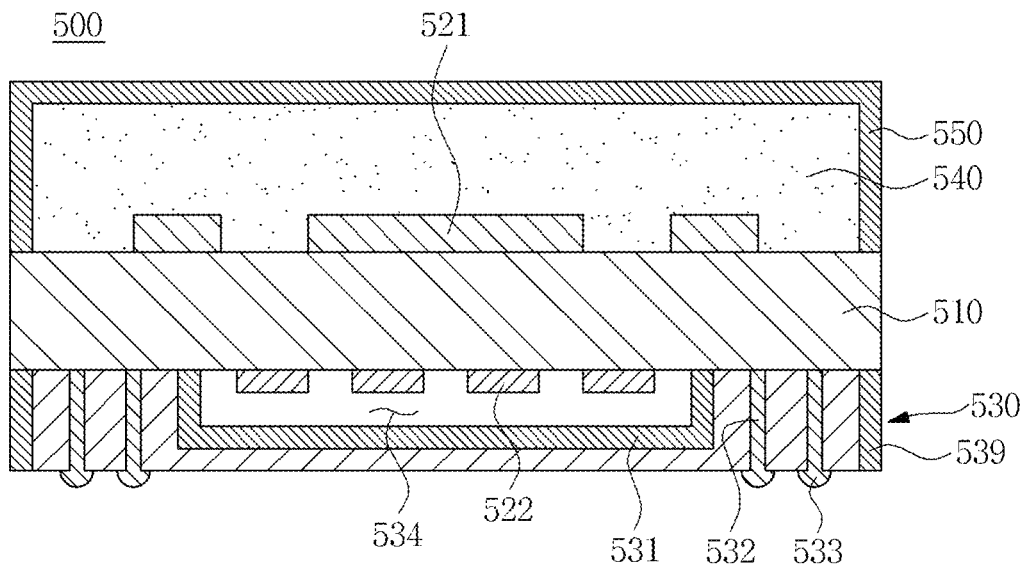
FIG. 12 is an exemplified diagram illustrating a semiconductor package according to a fifth preferred embodiment of the present invention.

FIG. 12 is an exemplified diagram illustrating a semiconductor package according to a fifth preferred embodiment of the present invention.

Referring to FIG. 12, a semiconductor package 500 may include a first electronic device 522, a second electronic device 521, a first substrate 510, a second substrate 530, a molding part 540, a shielding film 550, and an external connection terminal 533.

The first electronic device 522 is mounted on one surface of the first substrate 510. Further, the second electronic device 521 is mounted on the other surface of the first substrate 510. The first electronic device 522 and the second electronic device 521 may include various devices, such as a passive device and an active device, but any device which may be mounted in the first substrate 510 may be used.

The first substrate 510 has the first electronic device 522 and the second electronic device 521 mounted on both surfaces thereof. As the first substrate 510, various types of substrates which are known in the art may be used. Although not illustrated in FIG. 10, the first substrate 510 may be provided with a circuit layer. In addition, the first substrate 510 may be provided with the ground layer (not illustrated).

The second substrate 530 may be formed on one surface of the first substrate 510. As the second substrate 530, various types of substrates which are known in the art may be used.

Although not illustrated in FIG. 10, the second substrate 530 may be provided with a circuit layer of one or more layer. The circuit layer may include the circuit pattern, the connection pad, and a conductive via 532. The connection via 532 may be electrically connected with the circuit patterns which are formed in the second substrate 530. Further, the conductive via 532 may be connected to the connection pad to electrically connect the first substrate 510 to the second substrate 530. Further, although not illustrated, the second substrate 530 may be provided with a ground via (not illustrated) which is connected to the ground layer (not illustrated) of the first substrate 510.

The second substrate 530 may include an insertion part 534. Herein, the insertion part 534 may be formed in a region in which the first electronic device 522 is disposed. According to the preferred embodiment of the present invention, the insertion part 534 may be formed in a groove form. The insertion part 534 of the second substrate 530 is formed in a groove form, thereby improving the structural reliability of the second substrate 530. Further, it is possible to prevent the first electronic device 522 from being exposed to the outside. Therefore, the second substrate 530 may protect the first electronic device 522 from the external physical impact.

A wall surface and a bottom surface of the insertion part 534 may be provided with a first shielding wall 531. In addition, an outer wall of the second substrate 530 may be provided with a second shielding wall 539. The first shielding wall 531 and the second shielding wall 539 may be made of a conductive metal. A method for forming the first shielding wall 531 and the second shielding wall 539 may be formed by using any of the plating methods which are used in the art. The first shielding wall 531 and the second shielding wall 539 may be electrically connected to the ground via (not illustrated). According to the preferred embodiment of the present invention, the first shielding wall 531 may be formed in a form enclosing the first electronic device 522 inserted into the insertion part 534. The shielding between the first electronic device 422 (FIG. 10) and the outside of the semiconductor package 500 may be doubly performed by the so formed first shielding wall 531 and second shielding wall 539. Further, the shielding may be performed at both of a side and a bottom surface of the first electronic device 522 by the first shielding wall 531.

The molding part 540 may be formed on the other surface of the first substrate 510. The molding part 540 may seal the second electronic devices 521 which are formed on the other surface of the first substrate 510. The molding part 540 is filled between the second electronic devices 521 to be able to electrically insulate the first electronic devices 522 from each other. Further, the molding part 540 is formed to enclose the first electronic devices 522 to be able to protect the first electronic devices 522 from an external impact. The molding part 540 may be made of an insulating resin, such as epoxy resin.

The shielding film 550 may be formed to have a structure enclosing the molding part 540. The shielding film 550 may be made of a conductive material. For example, the shielding film 550 may be formed by applying a resin material including a conductive powder to an outer surface of the molding part 540. Alternatively, the shielding film 550 may be formed by attaching a metal thin film to the outer surface of the molding part 540. The shielding film 550 may be independently formed without being separately connected to other components or may be electrically connected to the ground layer (not illustrated) of the first substrate 510.

The external connection terminal 533 may be formed on one surface of the second substrate 530. The external connection terminal 533 may be electrically connected to the conductive via 532 or the connection pad (not illustrated) of the second substrate 530. The so formed external connection terminal 533 may electrically and physically connect the semiconductor package 500 to a main substrate (not illustrated) on which the semiconductor package 500 is mounted. For example, the external connection terminal 533 may be formed as a solder bump or a solder ball.

Although not illustrated in the preferred embodiment of the present invention, an insulating layer (not illustrated) may be formed between the first substrate 510 and the second substrate 530. The insulating layer may protect a conductive member (not illustrated), such as a bump, which to electrically connects the first substrate 510 to the second substrate 530. Further, the insulating layer (not illustrated) may improve an adhesion between the first substrate 510 and the second substrate 530. As such, the reliability of the semiconductor package 500 may be improved by the insulating layer (not illustrated).

The semiconductor package 500 according to the preferred embodiment of the present invention may improve the shielding function due to a bottom shielding structure and a double shielding structure.

Figure 13:
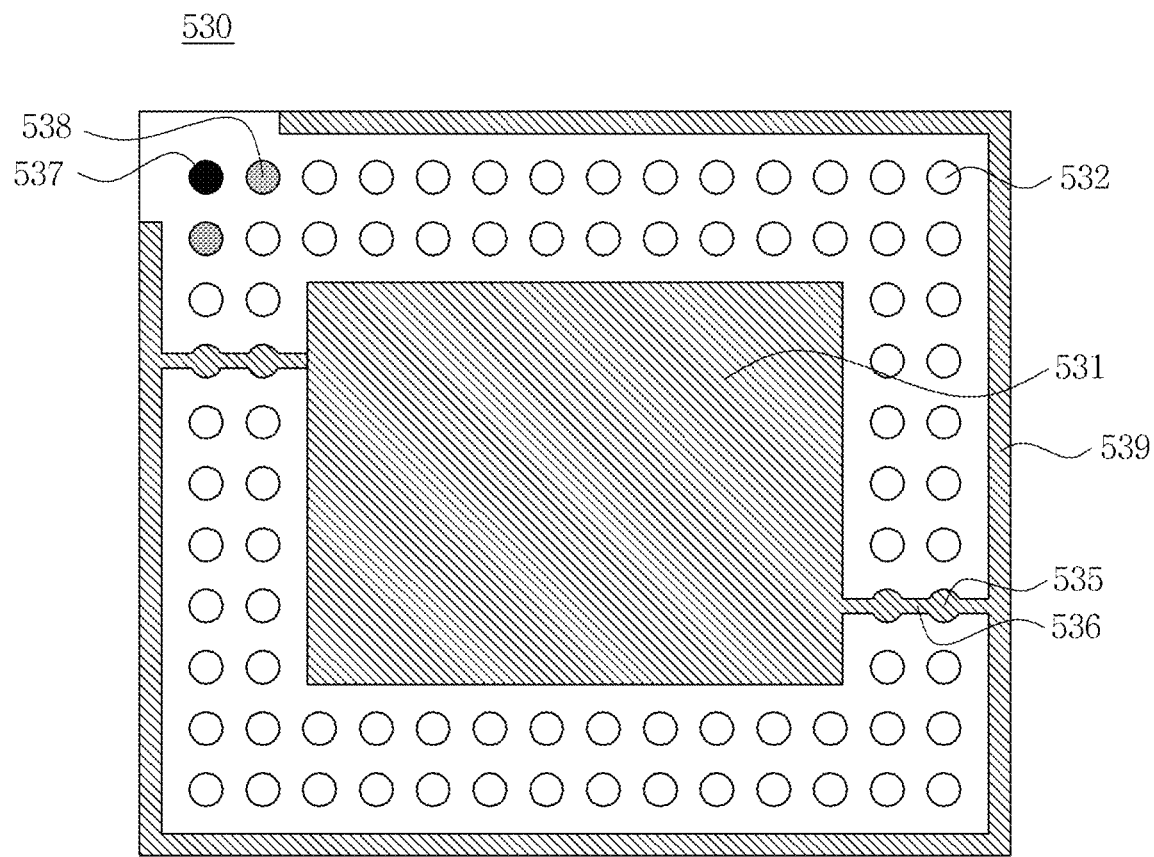
FIG. 13 is an exemplified diagram illustrating a cross section of a second substrate according to the fifth preferred embodiment of the present invention.

FIG. 13 is an exemplified diagram illustrating a cross section of a second substrate according to the fifth preferred embodiment of the present invention.

Referring to FIG. 13, the second substrate 530 includes the insertion part 534, a signal via 537, the first shielding wall 531, the second shielding wall 539, the ground via 535, the ground pattern 536, a shielding via 538, and the conductive via 532.

The insertion part 534 (FIG. 12) into which the first electronic device 522 (FIG. 12) is inserted may be formed in a groove shape as illustrated in FIG. 11.

The signal via 537 may electrically connect the first substrate 510 (FIG. 12) to at least one of the first electronic device 522 (FIG. 12) and the second electronic device 521 (FIG. 12) through the circuit layer. The signal via 537 may transmit an electric signal, such as an RF signal, to the outside or receive the electric signal from the outside. According to the preferred embodiment of the present invention, the signal via 537 may be formed at a corner portion of the second substrate 530.

The first shielding wall 531 may be formed on the wall surface and the bottom surface of the insertion part 534. In addition, the second shielding wall 539 may be formed on the outer wall of the second substrate 530. The second shielding wall 539 may be formed so as to open a region corresponding to a position at which the signal via 537 is formed. This is to prevent the performance of the signal via 537 transmitting and receiving the electric signal from reducing. When the first shielding wall 531 is formed to be spaced apart from the signal via 537 so as to be enough to keep the signal performance of the signal via 537, the formation of a separate opening region may be omitted.

The first shielding wall 531 and the second shielding wall 539 may be electrically connected to the ground via 535 through the ground pattern 536. In this case, as illustrated in FIG. 13, the first shielding wall 531 and the second shielding wall 539 may be connected to each other by the ground via 535 and the ground pattern 536. Alternatively, each of the first shielding wall 531 and the second shielding wall 539 may individually be connected to another ground via 535.

The ground via 535 may be electrically connected to the ground layer (not illustrated) of the first substrate 510 (FIG. 12). By the connection relationship, the shielding wall 531 may shield the first electronic device 522 (FIG. 12) from the outside of the semiconductor package 500 (FIG. 12).

The shielding via 538 may be formed to prevent the shielding performance from reducing when the opened region of the shielding wall 531 is large. Therefore, as illustrated in FIG. 13, the shielding via 538 may be formed at a position corresponding to the opened region of the shielding wall 531. In this case, a distance between the signal via 537 and the shielding via 538 may also be set to be a distance enough to keep the signal performance of the signal via 537. The shielding via 538 may be electrically connected to the ground layer (not illustrated) of the first substrate 510 (FIG. 12) to perform the shielding function.

The conductive via 532 may electrically connect the external connection terminal 533 (FIG. 12) to at least one of the circuit patterns which are formed in the first substrate 510 (FIG. 12) and the second substrate 530.

In the semiconductor packages 300, 400, and 500 illustrated in FIGS. 8 to 13, the inside of the insertion parts 334, 434, and 534 may be filled with the molding material (not illustrated). Herein, the molding material (not illustrated) is made of the same material as that of a second molding part 760 (FIG. 14) illustrated in FIG. 14 and the same effect may be derived.

Figure 14:
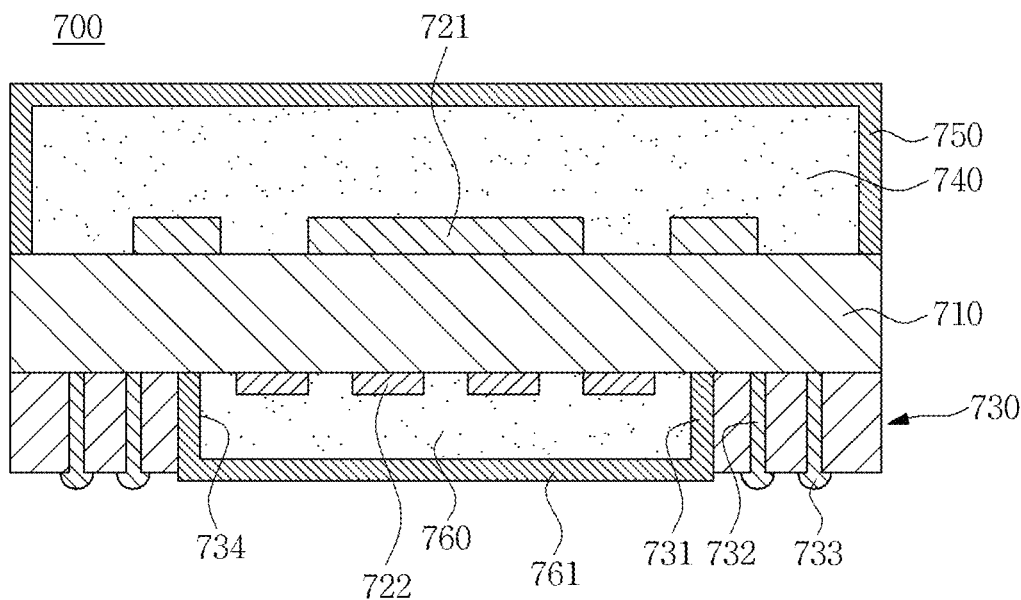
FIG. 14 is an exemplified diagram illustrating a semiconductor package according to a sixth preferred embodiment of the present invention.

FIG. 14 is an exemplified diagram illustrating a semiconductor package according to a sixth preferred embodiment of the present invention.

Referring to FIG. 14, a semiconductor package 700 may include a first electronic device 722, a second electronic device 721, a first substrate 710, a second substrate 730, a first molding part 740, a first shielding film 750, a second molding part 760, a second shielding film 761, and an external connection terminal 733.

The first electronic device 722 is mounted on one surface of the first substrate 710. Further, the second electronic device 721 is mounted on the other surface of the first substrate 710. The first electronic device 722 and the second electronic device 721 may include various devices, such as a passive device and an active device, but any device which may be mounted in the first substrate 710 may be used.

The first substrate 710 has the first electronic device 722 and the second electronic device 721 mounted on both surfaces thereof. As the first substrate 710, various types of substrates which are known in the art may be used. Although not illustrated in FIG. 14, the first substrate 710 may be provided with a circuit layer. In addition, the first substrate 710 may be provided with the ground layer (not illustrated).

The second substrate 730 may be formed on one surface of the first substrate 710. As the second substrate 730, various types of substrates which are known in the art may be used. Although not illustrated in FIG. 14, the second substrate 730 may be provided with a circuit layer of one or more layer. The circuit layer may include the circuit pattern, the connection pad, and a conductive via 732. The connection via 732 may be electrically connected with the circuit patterns which are formed in the second substrate 730. Further, the conductive via 732 may be connected to the connection pad to electrically connect the first substrate 710 to the second substrate 730. Further, although not illustrated, the second substrate 730 may be provided with a ground via (not illustrated) which is connected to the ground layer (not illustrated) of the first substrate 710.

The second substrate 730 may include an insertion part 734. Herein, the insertion part 734 may be formed in a region in which the first electronic device 722 is disposed. According to the preferred embodiment of the present invention, the insertion part 734 may be formed in a through hole form.

The wall surface of the insertion part 734 formed on the second substrate 730 may be provided with the shielding wall 731. The shielding wall 731 may be made of a conductive metal. A method for forming the shielding wall 731 may be formed by using any of the plating methods which are used in the art. The shielding wall 731 may be electrically connected to the ground via (not illustrated). According to the preferred embodiment of the present invention, the shielding wall 731 may be formed in a form enclosing the first electronic device 722 inserted into the insertion part 734. The shielding between the first electronic device 722 and the outside may be simultaneously performed at both of a side and a bottom surface of the shielding wall 731 by the above-mentioned structure.

The first molding part 740 may be formed on the other surface of the first substrate 710. The first molding part 740 may seal the second electronic devices 721 which are formed on the other surface of the first substrate 710. The first molding part 740 is filled between the second electronic devices 721 to be able to electrically insulate the first electronic devices 722 from each other. Further, the first molding part 740 is formed to enclose the first electronic devices 722 to be able to protect the first electronic devices 722 from an external impact. The first molding part 740 may be made of an insulating resin, such as epoxy resin.

The first shielding film 750 may be formed to have a structure enclosing the first molding part 740. The first shielding film 750 may be made of a conductive material. For example, the first shielding film 750 may be formed by applying a resin material including a conductive powder to an outer surface of the first molding part 740. Alternatively, the first shielding film 750 may be formed by attaching a metal thin film to the outer surface of the first molding part 740. The first shielding film 750 may be independently formed without being separately connected to other components or may be electrically connected to the ground layer (not illustrated) of the first substrate 710.

The second molding part 760 may be formed in the insertion part 734 of the second substrate 730. The second molding part 760 may be formed to seal the first electronic device 722 which is disposed in the insertion part 734. The second molding part 760 is filled between the first electronic devices 722 to be able to be electrically insulated from each other. As such, the second molding part 760 is formed in the insertion part 734 of the second substrate 730, thereby improving the structural reliability of the second substrate 730. Further, the second molding part 760 may prevent the first electronic device 722 from being exposed to the outside. Further, the second molding part 760 may protect the first electronic device 722 from the external physical impact. The second molding part 760 may be made of an insulating resin, such as epoxy resin. That is, the second molding part 760 may be made of one of the molding materials which are used in the art.

The second shielding film 761 may be formed on one surface of the second molding part 760. Herein, one surface is a bottom surface of the second molding part 760 in FIG. 14. The second shielding film 761 may be made of an electrically conductive metal. The second shielding film 761 may be formed by an electroplating method, an electroless plating method, a spraying method, and the like. A method for forming the second shielding film 761 is not limited thereto, and therefore the second shielding film 761 may be formed by using any of the plating methods which are used in the art. The second shielding film 761 may be electrically connected to the shielding wall 731 of the second substrate 730. Alternatively, the second shielding film 761 may be directly connected to the ground via (not illustrated). Therefore, the second shielding film 761 may also serve a shielding function.

The external connection terminal 733 may be formed on one surface of the second substrate 730. The external connection terminal 733 may be electrically connected to the conductive via 732 or the connection pad (not illustrated) of the second substrate 730. The so formed external connection terminal 733 may electrically and physically connect the semiconductor package 700 to a main substrate (not illustrated) on which the semiconductor package 700 is mounted. For example, the external connection terminal 733 may be formed as a solder bump or a solder ball.

Although not illustrated in the preferred embodiment of the present invention, an insulating layer (not illustrated) may be formed between the first substrate 710 and the second substrate 730. The insulating layer may protect a conductive member (not illustrated), such as a bump, which electrically connects the first substrate 710 to the second substrate 730. Further, the insulating layer (not illustrated) may improve an adhesion between the first substrate 710 and the second substrate 730. As such, the reliability of the semiconductor package 700 may be improved by the insulating layer (not illustrated).

According to the prior art, when the semiconductor package is mounted on the main board, the shielding layer (ground layer) is formed in the main board region in which the semiconductor package is mounted, so as to improve the shielding function. However, the semiconductor package 700 according to the preferred embodiment of the present invention has the second shielding film 761 formed on the bottom surface thereof, such that there is no need to form the shielding layer (ground layer) on the main board (not illustrated). Further, according to the semiconductor package 700 according to the preferred embodiment of the present invention, a wiring pattern may be formed in a region in which the shielding layer of the main board (not illustrated) is formed. That is, according to the semiconductor package 700 according to the preferred embodiment of the present invention, the freedom of design of the main board (not illustrated) may be increased.

Figure 15:
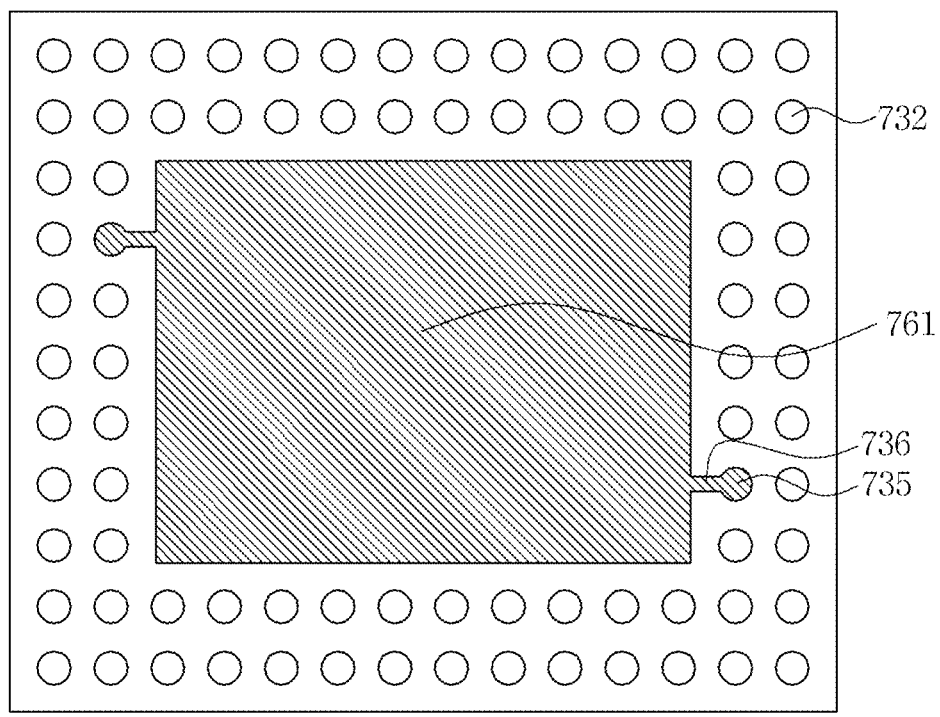
FIG. 15 is an exemplified diagram illustrating a cross section of a second substrate according to the sixth preferred embodiment of the present invention.

FIG. 15 is an exemplified diagram illustrating a cross section of a second substrate according to a sixth preferred embodiment of the present invention.

Referring to FIG. 15, the second substrate 730 includes the second shielding film 761, the ground via 735, the ground pattern 736, and the conductive via 732.

The second shielding film 761 may be formed in the insertion part 734 (FIG. 14) of the second substrate 730. The second shielding film 761 may be electrically connected to the shielding wall 731 (FIG. 14) which is formed along the wall surface of the insertion part 734 (FIG. 14). Alternatively, as illustrated in FIG. 14, the second shielding film 761 may be electrically connected to the ground via 735. Herein, the second shielding film 761 may be connected to the ground via 735 by the ground pattern 736.

The ground via 735 may be electrically connected to the ground layer (not illustrated) of the first substrate 710 (FIG. 14). That is, at least one of the shielding wall 731 (FIG. 14) and the second shielding film 761 may be electrically connected to the ground layer (not illustrated) through the ground via 735.

The conductive via 732 may electrically connect the external connection terminal 733 (FIG. 14) to at least one of the circuit patterns which are formed in the first substrate 710 (FIG. 14) and the second substrate 730.

The second substrate 730 may perform the shielding between the first electronic device 722 (FIG. 14) and the outside of the semiconductor package 700 (FIG. 14) by the second shielding film 761 and shielding wall 731 (FIG. 14) which have the above structure.

Figure 16:
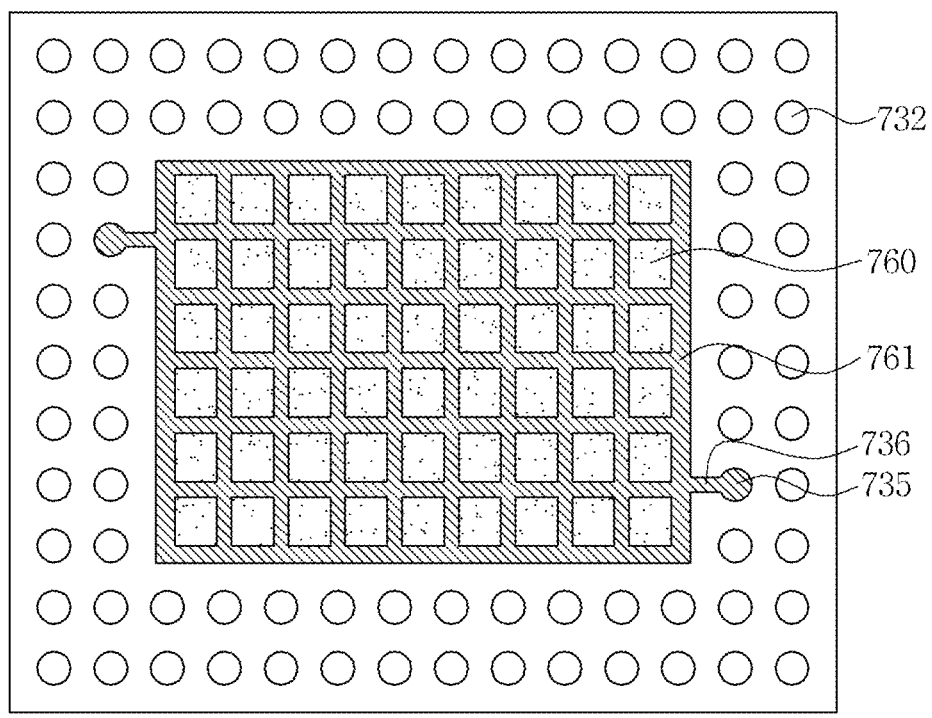
FIG. 16 is another exemplified diagram illustrating a cross section of the second substrate according to the sixth preferred embodiment of the present invention.

FIG. 16 is another exemplified diagram illustrating a cross section of the second substrate according to the sixth preferred embodiment of the present invention.

Referring to FIG. 16, the second substrate 730 includes the second shielding film 761, the second molding part 760, the ground via 735, the ground pattern 736, and the conductive via 732.

The second shielding film 761 may be formed on one surface of the second molding part 760 which is formed in the insertion part 734 (FIG. 14) of the second substrate 730. The second shielding film 761 may be electrically connected to the shielding wall 731 (FIG. 14) which is formed along the wall surface of the insertion part 734 (FIG. 14). Alternatively, as illustrated in FIG. 14, the second shielding film 761 may be electrically connected to the ground via 735. Herein, the second shielding film 761 may be connected to the ground via 735 by the ground pattern 736. According to the preferred embodiment of the present invention, the second shielding film 761 may be formed in a lattice form. An interval between the lattices of the second shielding film 761 may be set to be an interval enough to shield an electric signal, such as an RF signal. That is, the second shielding film 761 having the lattice structure according to the preferred embodiment of the present invention may have a sufficient shielding effect even when as illustrated in FIG. 15, the second shielding film 761 (FIG. 15) is not formed on the whole surface of the second molding part 760.

The ground via 735 may be electrically connected to the ground layer (not illustrated) of the first substrate 710 (FIG. 14). That is, at least one of the shielding wall 731 (FIG. 14) and the second shielding film 761 may be electrically connected to the ground layer (not illustrated) through the ground via 735.

The conductive via 732 may electrically connect the external connection terminal 733 (FIG. 14) to at least one of the circuit patterns which are formed in the first substrate 710 (FIG. 14) and the second substrate 730.

The second substrate 730 may perform the shielding between the first electronic device 722 (FIG. 14) and the outside of the semiconductor package 700 (FIG. 14) by the second shielding film 761 and shielding wall 731 which have the above structure.

Figure 17:
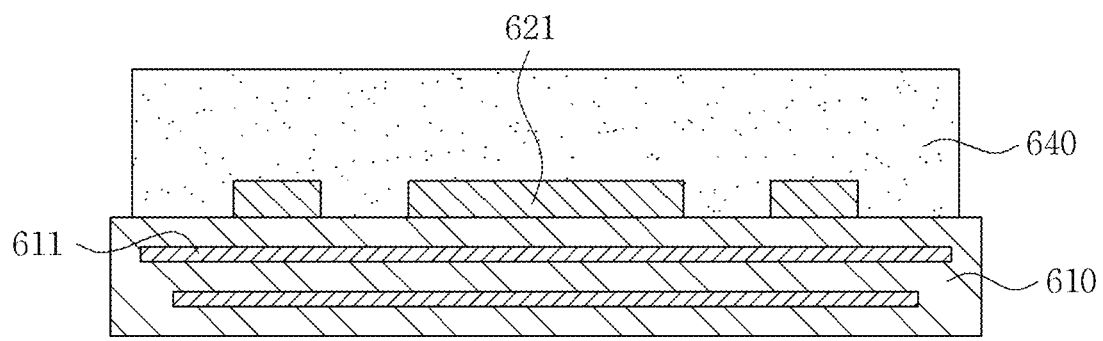
FIGS. 17 to 19 are exemplified views illustrating a method of forming a shielding film according to the preferred embodiment of the present invention.
Figure 18:
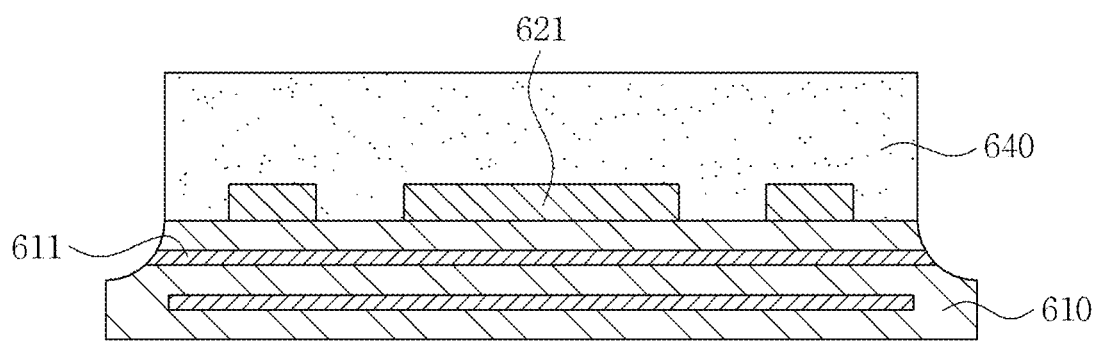
Figure 19:
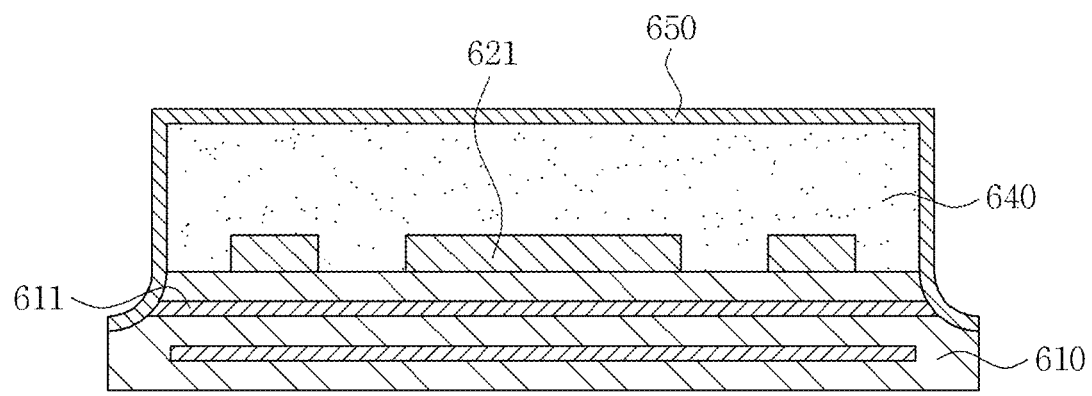

FIGS. 17 to 19 are exemplified views illustrating a method of forming the shielding film according to the preferred embodiment of the present invention.

In the method for forming the shielding film illustrated in FIGS. 17 to 19, the drawing and description of the second electronic device formed on one surface (bottom surface) of the first substrate 610 and the second substrate are the same as FIGS. 1 to 16 and therefore will be omitted.

Referring to FIG. 17, the first substrate 610 on which the molding part 640 is formed may be prepared. The first electronic device 622 may be mounted on the other surface (top surface) of the first substrate 610. The molding part 640 is formed on the other surface of the first substrate 610 to be able to enclose the first electronic devices 622.

A ground layer 611 may be formed in the first substrate 610. The ground layer 611 may be made of a conductive metal. The ground layer 611 may be formed by the structure and the method which are used in the circuit board field.

Referring to FIG. 18, the first substrate 610 may be patterned so that the ground layer 611 is exposed. As illustrated in FIG. 18, both surfaces of the first substrate 610 are removed by a chemical or physical method to be able to expose the ground layer 611 to the outside.

Referring to FIG. 19, a shielding film 650 is formed to enclose the molding part 640. In this case, the shielding film 650 may also be formed on the patterned portion of the first substrate 610. Therefore, the shielding wall 650 may be electrically connected to the ground layer 611. The shielding film 650 may be formed by the spraying method or the printing method. However, the method for forming the shielding film 650 is not limited thereto.

The semiconductor package according to the preferred embodiment of the present invention forms the shielding wall having various structures as well as the shielding film and the ground via to have the sufficient shielding area even when the semiconductor package is miniaturized. The semiconductor package has the sufficient shielding area, thereby improving the shielding ability. Further, the semiconductor package according to the preferred embodiment of the present invention simultaneously uses the shielding wall and the shielding via, thereby improving the shielding ability and keeping the signal performance of the signal via. Further, the signal via are freely formed by simultaneously using the shielding wall and the shielding via, thereby improving the freedom of design.

According to the preferred embodiments of the present invention, the semiconductor package can have the sufficient shielding area.

According to the preferred embodiments of the present invention, the semiconductor package can maintain the signal performance while improving the shielding ability improvement.

According to the preferred embodiments of the present invention, the semiconductor package can improve the freedom of design.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A semiconductor package, comprising:
    a first substrate having an first electronic device mounted on one surface of the first substrate and a second electronic device mounted on another surface of the first substrate facing the one surface;
    a first molding part sealing the second electronic device;
    a first shielding film formed on an external surface of the first molding part; and
    a second substrate bonded to the one surface of the first substrate and including an insertion part in which the first electronic device mounted on the one surface of the first substrate is inserted,
    wherein the second substrate includes a ground via, a first shielding wall which is formed along an inner wall of the second substrate, and
    a ground pattern connecting the ground via with the first shielding wall,
    wherein the first substrate includes a ground layer formed therein and connected to the first shielding film and the ground via,
    wherein the first electronic device includes at least one of a passive device and an active device, and
    wherein the second electronic device includes at least one of a passive device and an active device.

2. The semiconductor package as set forth in claim 1, wherein the ground layer is formed to have both ends exposed to an outside of the first substrate.

3. The semiconductor package as set forth in claim 1, wherein the second substrate further includes a signal via.

4. The semiconductor package as set forth in claim 1, wherein in the shielding wall, a region corresponding to a position at which the signal via is formed is opened.

5. The semiconductor package as set forth in claim 4, further comprising:
    a shielding via formed at the position corresponding to the opened region of the first shielding wall and formed on a straight line, along with the signal via.

6. The semiconductor package as set forth in claim 1, wherein the insertion part has a through hole form.

7. The semiconductor package as set forth in claim 1, wherein the insertion part has a groove form.

8. The semiconductor package as set forth in claim 7, wherein a bottom surface in the insertion part is further provided with the first shielding wall.

9. The semiconductor package as set forth in claim 1, wherein the first substrate is further provided with a circuit layer.

10. The semiconductor package as set forth in claim 1, wherein the second substrate further includes a conductive via which is electrically connected to the first substrate.

11. The semiconductor package as set forth in claim 10, further comprising:
    an external connection terminal formed on one surface of the second substrate and connected to the conductive via.

12. The semiconductor package as set forth in claim 6, further comprising:
    a second molding part formed in the insertion part to seal the first electronic device.

13. The semiconductor package as set forth in claim 12, further comprising:
    a second shielding film formed on one surface of the second molding part and electrically connected to the shielding wall.

14. The semiconductor package as set forth in claim 7, further comprising:
    a second molding part formed in the insertion part to seal the first electronic device.

15. The semiconductor package as set forth in claim 1, further comprising:
    a second shielding wall formed on an outer wall of the second substrate.

16. The semiconductor package as set forth in claim 13, wherein the first shielding film has a lattice form.

* * * * *